United States Patent [19]

Matsumoto

[11] Patent Number: 5,379,038
[45] Date of Patent: Jan. 3, 1995

[54] PARALLEL-SERIAL DATA CONVERTER

[75] Inventor: Yoshimi Matsumoto, Kanagawa, Japan

[73] Assignee: NEC Corporation, Tokyo, Japan

[21] Appl. No.: 101,922

[22] Filed: Aug. 4, 1993

[30] Foreign Application Priority Data

Aug. 6, 1992 [JP] Japan .................................. 4-209909

[51] Int. Cl.$^6$ .............................................. H03M 9/00
[52] U.S. Cl. ........................................ 341/101; 341/93
[58] Field of Search .......................... 341/100, 101, 93

[56] References Cited

U.S. PATENT DOCUMENTS

| | | | |
|---|---|---|---|
| 3,631,464 | 12/1971 | Dahlberg | 341/101 |
| 4,218,758 | 8/1980 | Allen et al. | 341/101 |
| 4,377,806 | 3/1983 | Elliott et al. | 341/101 |
| 4,429,300 | 1/1984 | Yamasawa et al. | 341/100 |
| 5,128,673 | 7/1992 | Tamamura et al. | 341/100 |

*Primary Examiner*—Marc S. Hoff
*Attorney, Agent, or Firm*—Whitham, Curtis, Whitham & McGinn

[57] ABSTRACT

A parallel-serial data converter according to the present invention comprises a n-th latch circuit which latches the sign bit at the most significant bit of parallel data, a n−1th selector which selects either of the n−1th bit or the ground level, a n−1th latch circuit which latches the output from the selector n−1, a i-th selector which selects either of the i-th bit (i=n−2, n−3, ..., 2, 1) of the parallel data or the output from the i+1th latch circuit, a i-th latch circuit which latches the output from the i-th selector, a n-th selector which selects either of the output from the first inverter to reverse the output from the first latch circuit or the output from the first latch circuit, a n+1th selector which selects either of the output from a second inverter to reverse the output from the n-th selector or the output from the n-th selector for output as serial data in two's complement notation, a set latch circuit which is set according to the STORE signal and latches the output from the first AND circuit to take the logical AND the output form the n-th selector and the selection signal as well as a second AND circuit which takes the logical AND the output from the set latch circuit and the output from the n-th latch circuit for output as the selection signal.

7 Claims, 10 Drawing Sheets

PARALLEL-SERIAL DATA CONVERTER

BACKGROUND OF THE INVENTION

1. Field of the Invention

The present invention relates to a parallel-serial data converter and particularly relates to a parallel-serial data converter which converts parallel data in sign magnitude notation into serial data in two's complement notation.

2. Description of the Related Art

Figure 9:
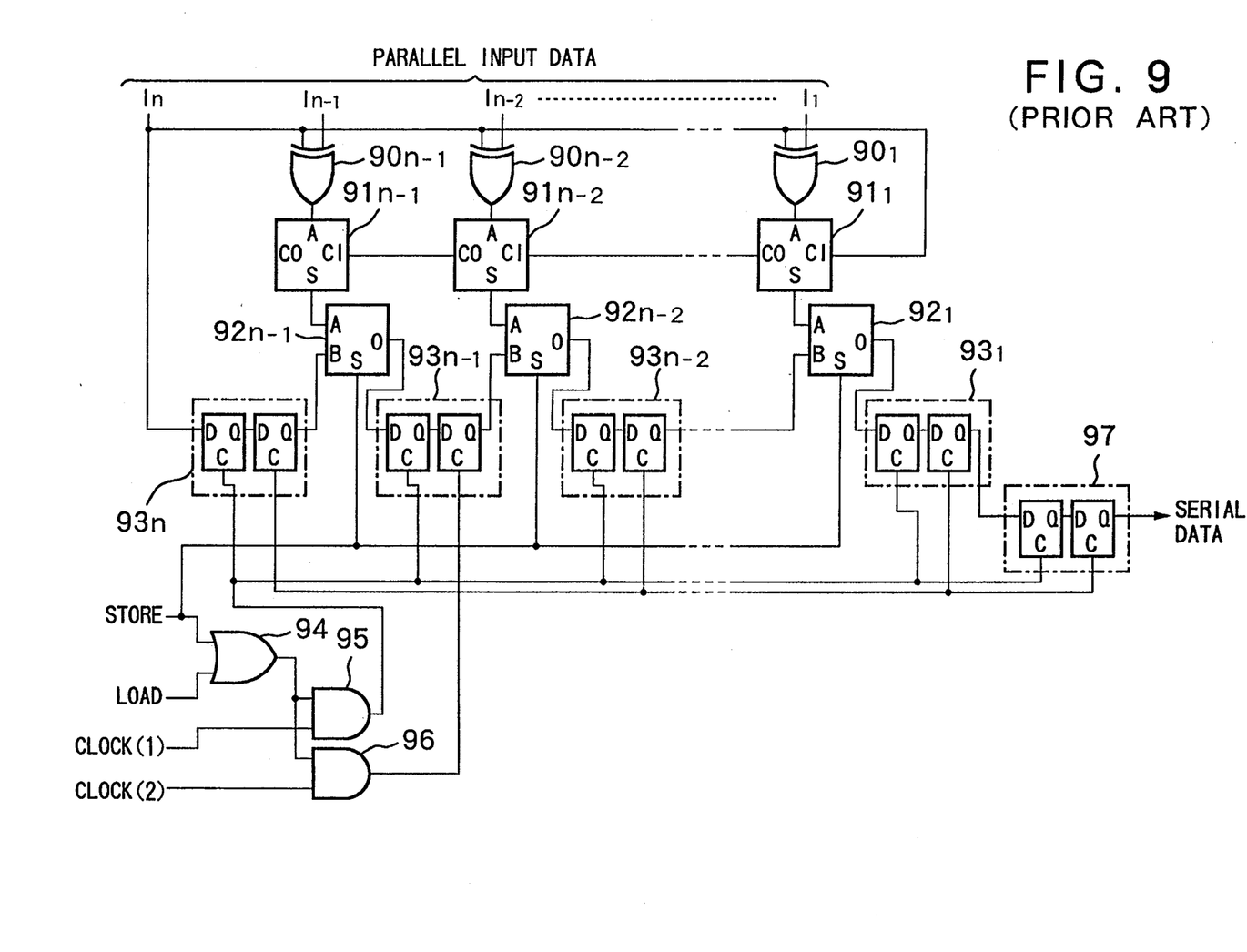
FIG. 9 is a block diagram to show the configuration of a conventional parallel-serial data converter.

As shown in FIG. 9, a parallel-serial data converter to convert parallel data in sign magnitude notation into serial data in two's complement notation generally comprises EXOR (exclusive-OR) circuits $90_1, \ldots, 90_{n-2}$ and $90_{n-1}$, adders $91_1, \ldots, 91_{n-2}$ and $91_{n-2}$, selectors $92_1, \ldots, 92_{n-2}$ and $92_{n-1}$, latch circuits $93_1, \ldots, 93_{n-2}$ and $93_{n-1}$ and another latch circuit $93_n$, an OR circuit 94, AND circuits 95 and 96 and a still another latch circuit 97. From n (positive integer) bits of parallel data in sign magnitude notation $I_1, \ldots, I_{n-2}, I_{n-1}$ and $I_n$, the sign bit $I_n$ and each of the remaining bits $I_1$ to $I_{n-1}$ are sent to the EXOR circuits $90_1, \ldots, 90_{n-2}$ and $90_{n-1}$ respectively. The outputs from the EXOR circuits $90_1, \ldots, 90_{n-2}$ and $90_{n-1}$ are sent to the adders $91_1, \ldots, 91_{n-2}$ and $91_{n-2}$ where the carry output from less significant bit is treated as the carry input. The addition results from the adders and the outputs from the latch circuits $93_1, \ldots, 93_{n-2}, 93_{n-1}$ and 93 n are given as inputs A and B to the selectors $92_1, \ldots, 92_{n-2}$ and $92_{n-1}$, each of which selects either of A or B according to the STORE signal. The outputs from the selectors $92_1, \ldots, 92_{n-2}$ and $92_{n-1}$ are input to the latch circuits $93_1, 93_{n-2}$ and $93_{n-1}$. The latch circuit $93_n$ receives the sign bit $I_n$ as the data input. The OR circuit 94 takes the logical OR the STORE and LOAD signals. The AND circuit 95 takes the logical AND the output from the OR circuit 94 and the CLOCK (1) signal, and the AND circuit 96 takes the logical AND the output from the OR circuit 94 and the CLOCK (2) signal. The latch circuit 97 outputs serial data.

Each of the latch circuits $93_n$ to $93_1$ and the latch circuit 97 comprises a two-phase flip-flop of D type and receives the output from the AND circuit 95 as the master clock and the output from the AND circuit 96 as the slave clock.

Figure 10:
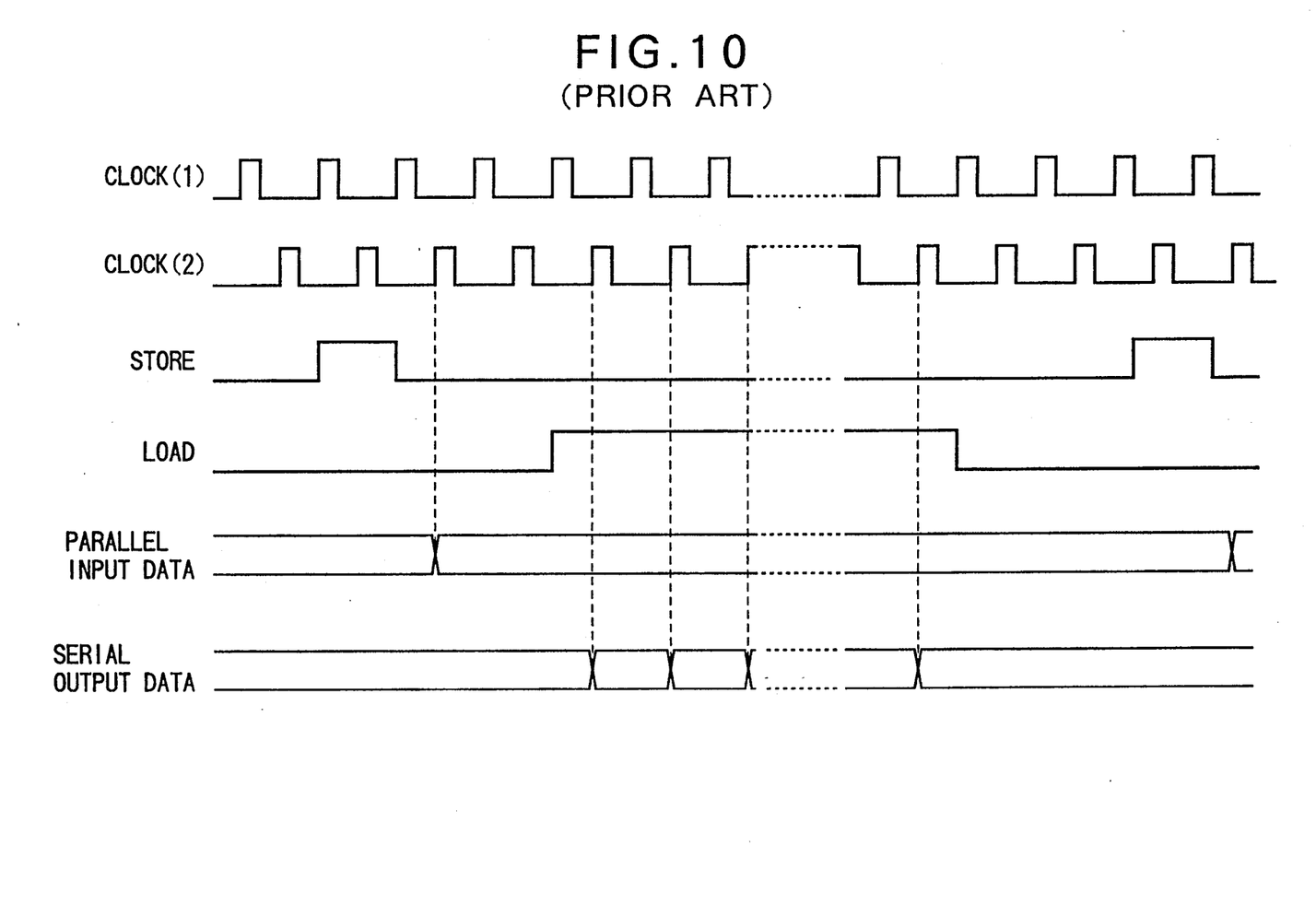
FIG. 10 is a timing chart to illustrate the operation of the circuit shown in FIG. 9.

FIG. 10 is a timing chart of input/output signals for such a conventional embodiment. Referring to FIGS. 9 and 10, the operation in a conventional embodiment will be described below.

Firstly, when the parallel data $I_1$ to $I_n$ in sign magnitude notation are positive, the sign bit $I_n$ is at "L" level. The parallel data $I_1, \ldots, I_{n-2}$ and $I_{n-1}$ in sign magnitude notation are output as they are from the EXOR circuits $90_1, \ldots, 90_{n-2}$ and $90_{n-1}$ serving as discrepancy detectors. They are sent to the corresponding adders $91_1, \ldots 91_{n-2}$ and $91_{n-1}$ and output as they are again. If the STORE signal is at H level, the selectors $92_1, \ldots, 92_{n-2}$ and $92_{n-1}$ select input A for output, which causes the outputs from the adders $91_1, \ldots, 91_{n-2}$ and $91_{n-1}$ to be sent to the latch circuits $93_1, \ldots, 93_{n-1}$. The latch circuit 93 n directly fetches the sign bit $I_n$. If the LOAD signal is at H level, the selectors $92_1, \ldots, 92_{n-2}$ and $92_{n-1}$ select input B for output and each time the CLOCK signal (2) rises, latch data from the latch circuits $93_1$ to $93_n$ are subsequently output from the latch circuit 97 as serial data in two's complement notation.

Next, when the parallel data $I_1$ to $I_n$ in sign magnitude notation are negative, the sign bit $I_n$ is at "H" level. The parallel data $I_1, \ldots, I_{n-2}$ and $I_{n-1}$ in sign magnitude notation are, at the EXOR circuits $90_1, \ldots, 90_{n-2}$, $90_{n-1}$ serving as discrepancy detectors, output with the level reversed and sent to the corresponding adders $91_1, \ldots, 91_{n-2}$ and $91_{n-1}$ for addition and output. If the STORE signal is at H level, the selectors $92_1, 92_{n-2}$ and $92_{n-1}$ select input A for output and the outputs from the adders $91_1, \ldots$ and $91_{n-2}, 91_{n-1}$ are sent to the latch circuits $93_1, \ldots$ and $93_{n-1}$. The latch circuit $93_n$ directly fetches the sign bit $I_n$. If the LOAD signal is at H level, the selectors $92_1, \ldots, 92_{n-2}$ and $92_{n-1}$ select input B for output. As a result, the data from the latch circuits $93_1$ to $93_n$ are output from the latch circuit 97 as serial data in two's complement notation.

Thus, parallel data in sign magnitude notation are converted into and output as serial data in two's complement notation when two is at the LSB first. In such a conventional parallel-serial data converter, the operation to convert parallel data in sign magnitude notation into serial data in two's complement notation applies to the parallel data. This means that the converter must have as many EXOR circuits and adders as the number of bits contained in the data to be converted. This may result in a huge circuit scale.

SUMMARY OF THE INVENTION

An object of the present invention is to provide a parallel-serial data converter with a smaller circuit scale. The parallel-serial data converter of the present invention is particularly effective when applied to a circuit for conversion of data with a large number of bits.

According to a preferred embodiment of the present invention to attain the above object, a parallel-serial data converter comprises a n-th latch circuit which latches the sign bit at the most significant bit of the parallel data of n (positive integer) bits in sign magnitude notation according to the STORE signal, a n−1th selector which receives the n−1th bit of the parallel data as the first input and the ground level as the second input and selects either of them for output according to the STORE signal, a n−1th latch circuit which latches the output from the n−1th selector according to the predetermined CLOCK signal, a i-th selector which receives the i-th bit of the parallel data (i=n−2, n−3, . . . , 2 and 1) as the first input and the output from a i+1th latch circuit as the second input and selects either of them for output according to the STORE signal, a i-th latch circuit which latches the output from the i-th selector according to the CLOCK signal, a first inverter which inverts the output from the first latch circuit, a n-th selector which receives the output from the first inverter as the first input and the output from the first latch circuit as the second input and selects either of them for output according to the output from the n-th latch circuit, a second inverter which inverts the output from the selector n, a selector n+1 which receives the output from the second inverter as the first input and the output from the selector n as the second input and selects either of them according to the predetermined selection signal for output as the serial data in two's complement notation, a first AND circuit which takes the logical AND the output from the n-th selector and the selection signal, a set latch circuit which is set according to the STORE signal and latches the output from the first AND circuit according to the CLOCK signal, and a second AND circuit which takes the logical AND the output from the set latch circuit and the output from the n-th latch circuit for output as the selection signal.

According to another preferred embodiment of a parallel-serial data converter according to the present invention, the n-th latch circuit, the n−1th latch circuit and the i-th latch circuit comprise D type flip-flops.

According to a further preferred embodiment, the n−1th and i-th latch circuits are designed to operate according to the master/slave method with two D type flip-flops which make latching according to CLOCK signals of two different phases. In addition, a parallel-serial data converter further comprises an OR circuit which takes the logical OR the STORE signal and LOAD signal to direct serial data output and an AND circuit which takes the logical AND the output from the OR circuit and the CLOCK signal, the output from the AND circuit being used as the clock signal for the n−1th latch circuit, the i-th latch circuit and the set latch circuit.

According to still another preferred embodiment of the present invention to attain the above object, a parallel-serial data converter to convert parallel data of n (positive integer) bits in sign magnitude notation into serial data in two's complement notation comprises a n−1th selector which receives the n−1th bit of the parallel data as the first input and the ground level as the second input and selects either of them for output according to the reversed LOAD signal, a n−1th latch circuit which latches the output from the n−1th selector according to the predetermined CLOCK signal, a i-th selector which receives the i-th bit of the parallel data (i=n−2, n−3, ..., 2 and 1) as the first input and the output from the i+1th latch circuit as the second input and selects either of them for output according to the reversed LOAD signal, a i-th latch circuit which latches the output from the i-th selector according to the CLOCK signal, a first inverter which reverses the output from the first latch circuit, a n-th selector which receives the output from the first inverter as the first input and the output from the first latch circuit as the second input and selects either of them for output according to the sign bit of the parallel data, a second inverter which reverses the output from the n-th selector, a n+1th selector which receives the output from the second inverter as the first input and the output from the n-th selector as the second input and selects either of them according to the predetermined selection signal for output as the serial data in two's complement notation, a first AND circuit which takes the logical AND the output from the n-th selector and the selection signal, a set latch circuit which is set according to the STORE signal and latches the output from the first AND circuit according to the CLOCK signal, and a second AND circuit which takes the logical AND the output from the set latch circuit and the sign bit of the parallel data for output as the selection signal.

According to a further preferred embodiment, the n−1th and i-th latch circuits are designed to operate according to the master/slave method with two D type flip-flops which make latching according to CLOCK signals of two different phases.

Other objects, characteristics and effects of the present invention will be clarified in the detailed description below.

DESCRIPTION OF THE PREFERRED EMBODIMENT

Referring to the attached figures, preferred embodiments of the present inventions will be described in details below.

Figure 1:
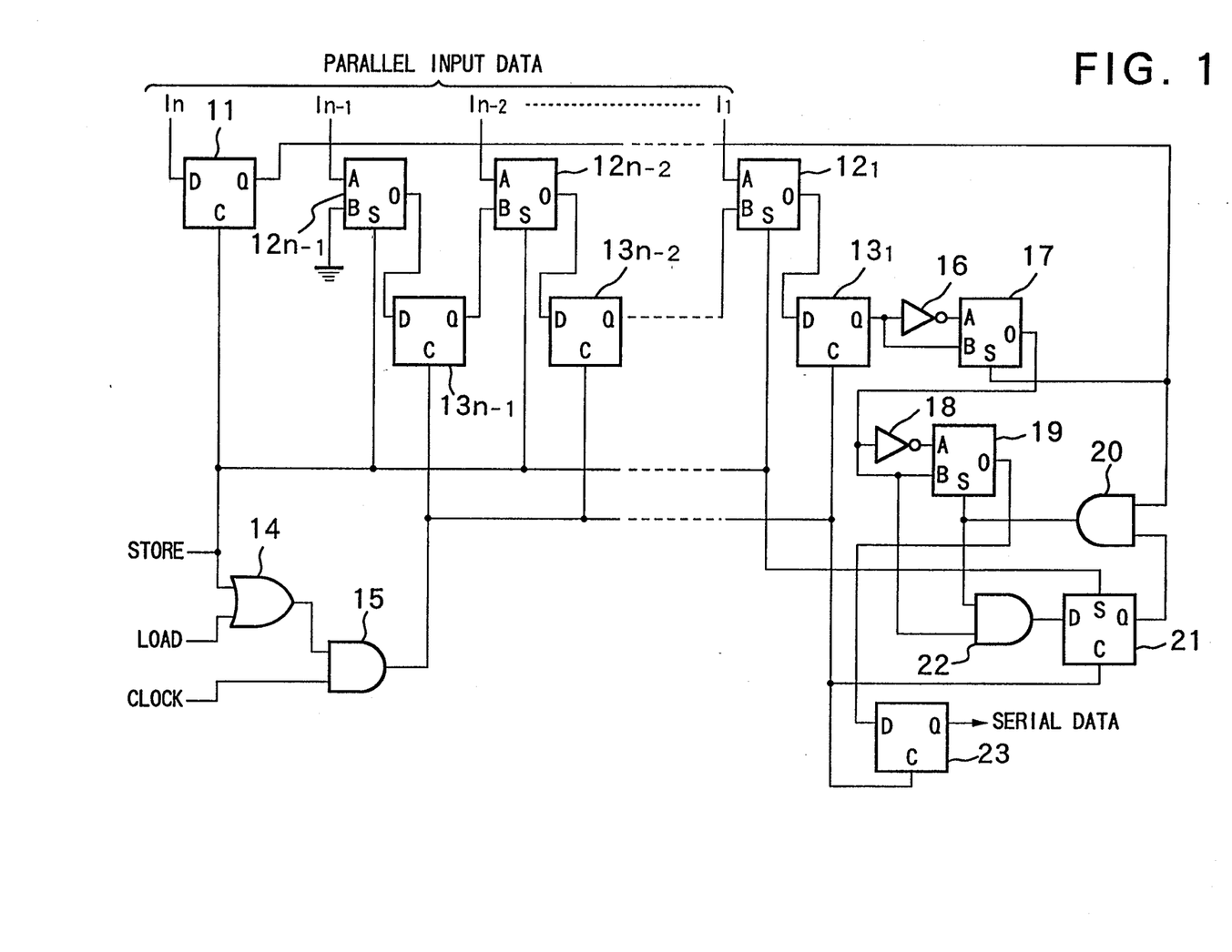
FIG. 1 is a block diagram to show the configuration of a parallel-serial data converter according to a first embodiment of the present invention.

FIG. 1 shows the configuration of a parallel-serial data converter according to a first embodiment of the present invention. In the figure, a parallel-serial data converter of the present invention comprises latch circuits 11, $13_{n-1}$ to $13_1$ and 23, selectors $12_{n-1}$ to $12_1$, 17, 19 and 21, an OR circuit 14, AND circuits 15, 20 and 22, inverters 16 and 18 as well as a set latch circuit 21.

The latch circuit 11 processes parallel data having n bits in sign magnitude notation ($I_1, \ldots, I_{n-2}, I_{n-1}$, and $I_n$) to latch the data $I_n$ serving as the sign bit according to the STORE signal. The selector $12_{n-1}$ receives, from n bits of parallel data in sign magnitude notation, the data $I_{n-1}$ as input A, and receives the ground potential as input B and selects either of them according to the STORE signal. The selectors $12_{n-2}$ to $12_1$ have the parallel data $I_1$ to $I_{n-2}$ as input A and the output from the latch circuits $13_{n-1}$ to $13_2$ as input B and select either of them according to the STORE signal. The latch circuits $13_{n-1}$ to $13_1$ receive the outputs from the selectors $12_{n-1}$ to $12_1$.

The OR circuit 14 takes the logical OR the STORE signal and the LOAD signal and the AND circuit 15 takes the logical AND the output from the OR circuit 14 and the CLOCK signal. The above latch circuits $13_{n-1}$ to $13_1$ operate using the output from the AND circuit 15 as the clock.

The selector 17 receives the output from the inverter 16 where the output from the latch circuit $13_1$ is reversed as input A and the output from the latch circuit $13_1$ as input B and selects either of them according to the output from the latch circuit 11. The selector 19 receives the output of the inverter 18 where the output from the selector 17 is inverted as input A and the output of the selector 17 as input B and selects either of them according to the output from the AND circuit 20. The set latch circuit 21 receives the output from the AND circuit 22 which takes the logical AND the output from the AND circuit 20 and the output from the selector 17 as the input D and the STORE signal as a set signal. The AND circuit 20 takes the logical AND the output from the latch circuit 11 and the set latch circuit 21. The latch circuit 23 receives the output from the selector 19 as the data input and operates with using the output from the AND circuit 15 as the clock so as to output serial data.

Figure 2:
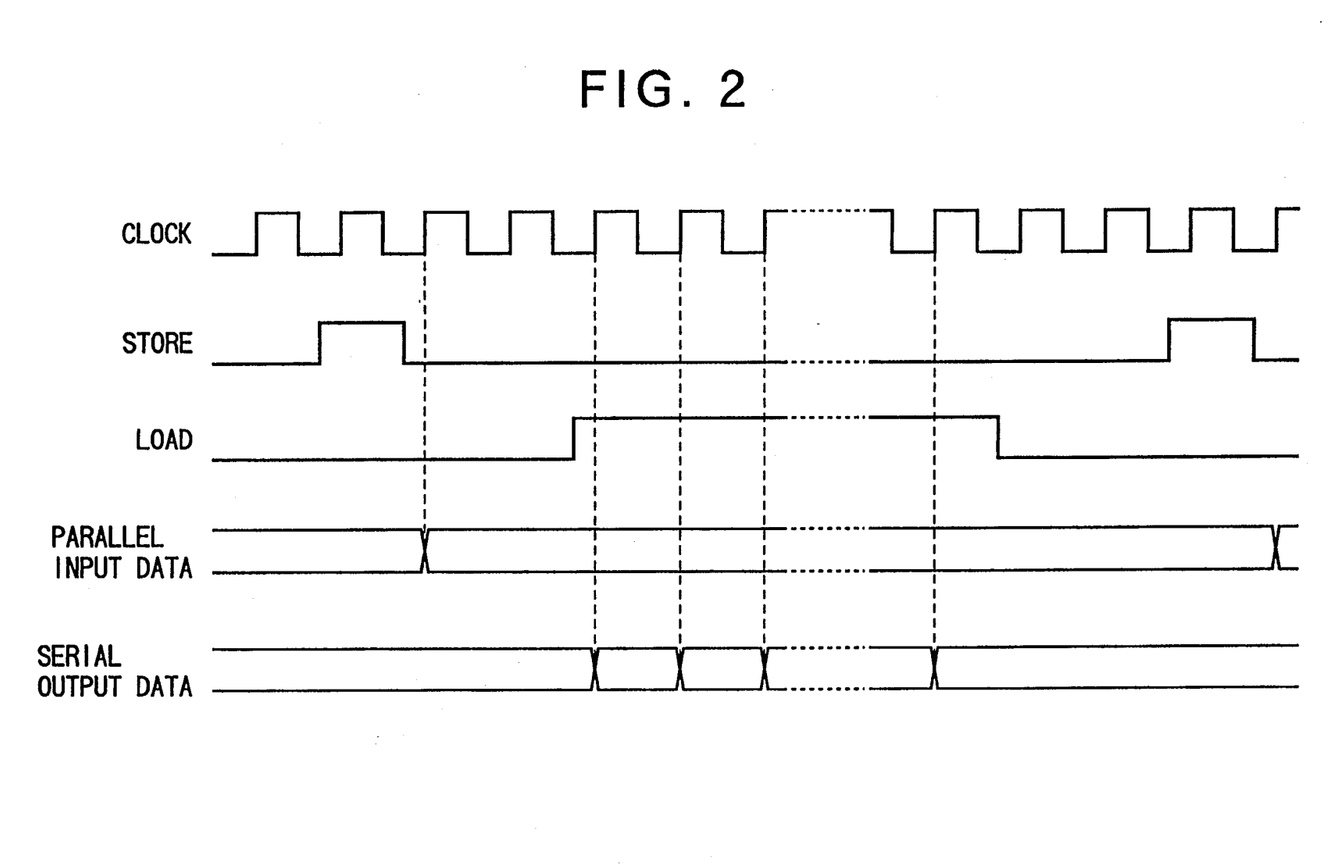
FIG. 2 is a timing chart to show the operation of the first embodiment.

FIG. 2 is a timing chart of input/output signals related to the operation according to the first embodiment. Referring to the figure, when the parallel data $I_1$, ..., $I_{n-2}$, $I_{n-1}$ and $I_n$ in sign magnitude notation are positive, the sign bit $I_n$ is latched by the latch circuit 11 according to the STORE signal. The remaining parallel data $I_1$, $I_{n-2}$ and $I_{n-1}$ are processed differently depending on the STORE signal level. If the STORE signal is at H level, the selectors $12_1$, ..., $12_{n-2}$ and $12_{n-1}$ select input A, which is in turn latched by the latch circuits $13_1$, ..., $13_{n-2}$ and $13_{n-1}$ respectively according to the output from the AND circuit 15. At the same time, the set latch circuit 21 is set via the STORE signal at H level. If the STORE signal is at L level, the selectors $12_1$, ..., $12_{n-2}$, $12_{n-1}$ select input B, with resulting in serial connection of the latch circuits $13_1$ to $13_{n-1}$. In this case, however, the input to the latch circuit $13_{n-1}$ is the ground potential, or at L level. At the selectors 17 and 19, the output from the latch circuit 11 is at L level, and the output from the AND circuit 20 is also at L level. This means that both selectors select input B.

If the LOAD signal becomes H under such conditions, the AND circuit 15 outputs the clock signal. Each time the CLOCK signal rises, the latch circuit 23 subsequently outputs serial data in two's complement notation. The serial data are output one by one from the least significant bit.

When the parallel data $I_1$, ..., $I_{n-2}$, $I_{n-1}$ and $I_n$ in sign magnitude notation are negative, the sign bit $I_n$ is at H level. The sign bit $I_n$ is latched and stored by the latch circuit 11 according to the STORE signal. The remaining data $I_1$, ..., $I_{n-2}$ and $I_{n-1}$ are processed differently depending on the STORE signal level. If the STORE signal is at H level, the selectors $12_1$, ..., $12_{n-2}$ and $12_{n-1}$ select input A, which is in turn latched by the latch circuits $13_1$, $13_{n-2}$ and $13_{n-1}$ respectively according to the output from the AND circuit 15. At the same time, the set latch circuit 11 is set via the STORE signal. If the STORE signal is at L level, the selectors $12_1$, ... , $12_{n-2}$ and $12_{n-1}$ select input B, with resulting in serial connection of the latch circuits $13_1$, ..., $13_{n-2}$ and $13_{n-1}$. In this case, however, the input to the latch circuit $13_{n-1}$ is the ground potential. The selector 17 selects input A for output because the output from the latch circuit 11 is at H level.

If the LOAD signal is at H level, the outputs from the latch circuit $13_1$ are reversed before being output from the selector 17. Since the output from the latch circuit 11 is at H level, the output level of the AND circuit 20 depends on the output level of the set latch circuit 21. Note that the set latch circuit 21 is in set status at first with its output level at "H". Therefore, the output level of the AND circuit 20 is at H level at first, which causes the selector 19 to select input A for output.

The data output from the latch circuit $13_1$ via the CLOCK signal from the AND circuit 15 is reversed twice during the first CLOCK signal (H level) at the selectors 17 and 19 which select input A as described above and as a result output the data to the latch circuit 23 as it is. For example, the latch circuit 23 provides "1" if the first output data from the latch circuit 13 1 is "1", and "0" if it is "0".

During the next CLOCK signal (H level), a value determined by the AND circuit 22 as the logical product of the set signal selected by the previous cycle CLOCK signal (output from the AND circuit 20) and the previous cycle output from the selector 17 is latched by the set latch circuit 21, output via the AND circuit 20 and sent to the selector terminal S of the selector 19 so that either of input A or B is selected.

If the latch circuit $13_1$ outputs "0" as the first output data and "1" as the second output data, since the set signal selected according to the CLOCK signal of the previous cycle (output from the AND circuit 20) is "1" and the output from the selector 17 of the previous cycle is inverted to be "1", the AND circuit 22 outputs "1" and the AND circuit 20 outputs "1". Therefore, the selector 19 selects input A, which causes the above second output data "1" to be inverted twice and read out as "1". If the latch circuit $13_1$ outputs "1" as the first output data and "1" as the second output data, then the set signal selected according to the CLOCK signal of the previous cycle (output from the AND circuit 20) is "1" and the output from the selector 17 of the previous cycle is reversed to be "0", and the AND circuit 22 outputs "0" and the AND circuit 20 outputs "0". Therefore, the selector 19 selects input B and the above second output data "1" is reversed once and read out as "0".

Thus, serial data in two's complement notation from the latch circuit 23 is output synchronizing with the CLOCK signal.

In the first embodiment of FIG. 1, the selectors $12_{n-1}$ to $12_1$ and the selectors 17 and 19 should be set to have a delay time exceeding the rise time of the clock signal so as to ensure latching at the latch circuits $13_{n-1}$ to $13_1$ and the latch circuit 23. If the selectors $12_{n-1}$ to $12_1$ and selectors 17 and 19 have a delay time shorter than the rise time of the clock signal, the first rising of the clock signal upon entering of LOAD signal to H level causes the latch circuits $13_{n-1}$ to $13_1$ and the latch circuit 23 to enter "through" status and all of them have the same level as the ground potential (L level).

If the selectors $12_{n-1}$ to $12_1$ and the selectors 17 and 19 have a delay time more than the rise time of the clock signal, then the parallel data latched by the latch circuits $13_{n-1}$ to $13_1$ are subsequently transmitted.

In conversion of parallel data in sign magnitude notation into serial data in two's complement notation, the sign bit data and the data other than the sign bit are handled differently. In the first embodiment of the present invention, "0" is given to the latch circuit $13_{n-1}$ to prevent the data serially output from the latch circuit $13_1$ from being reversed together with the sign bit at the selector 17, even when the data is negative. Thus, a converter according to the first embodiment is capable of data conversion without judging whether each data bit in serial output is a sign bit or not.

Figure 3:
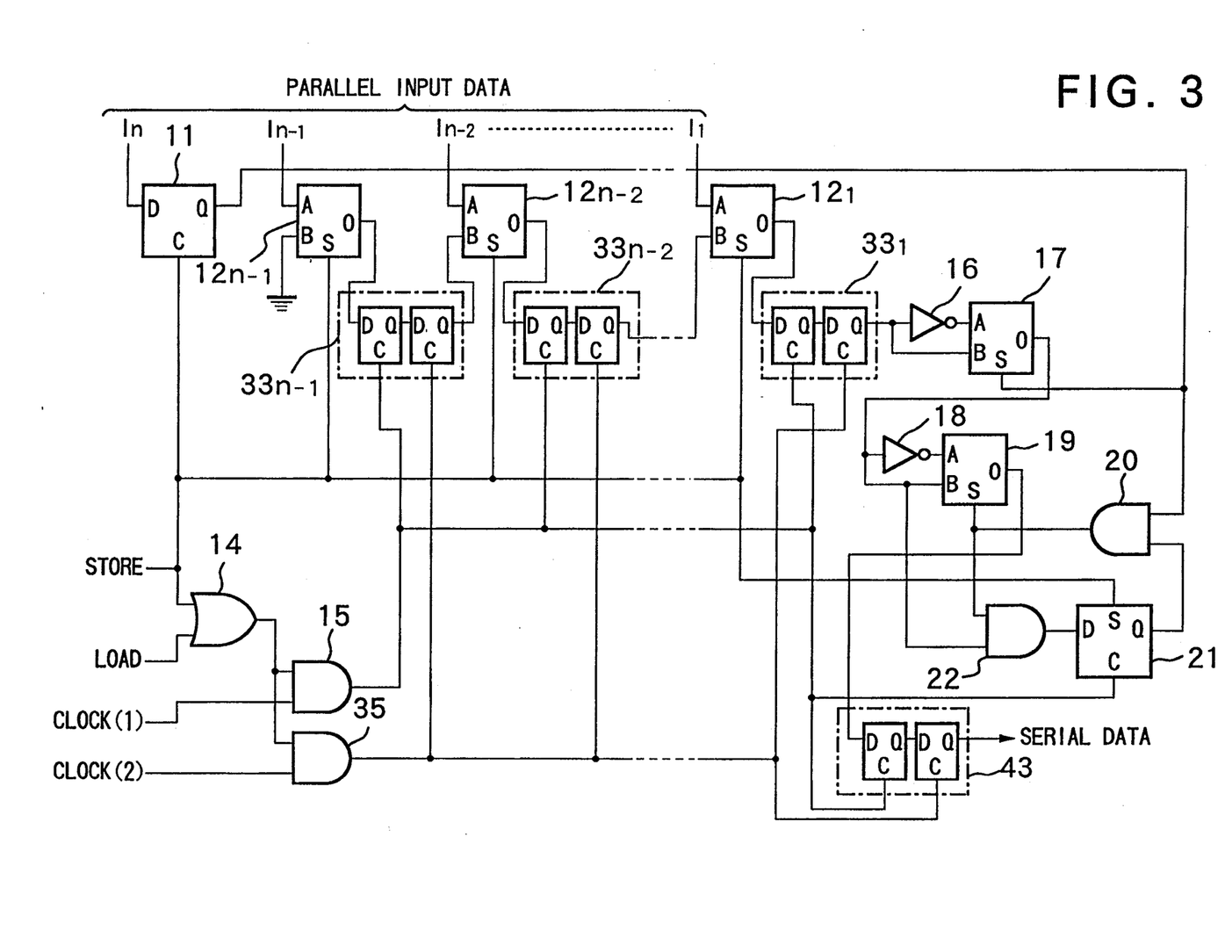
FIG. 3 is a block diagram to show the configuration of a parallel-serial data converter according to a second embodiment of the present invention.
Figure 4:
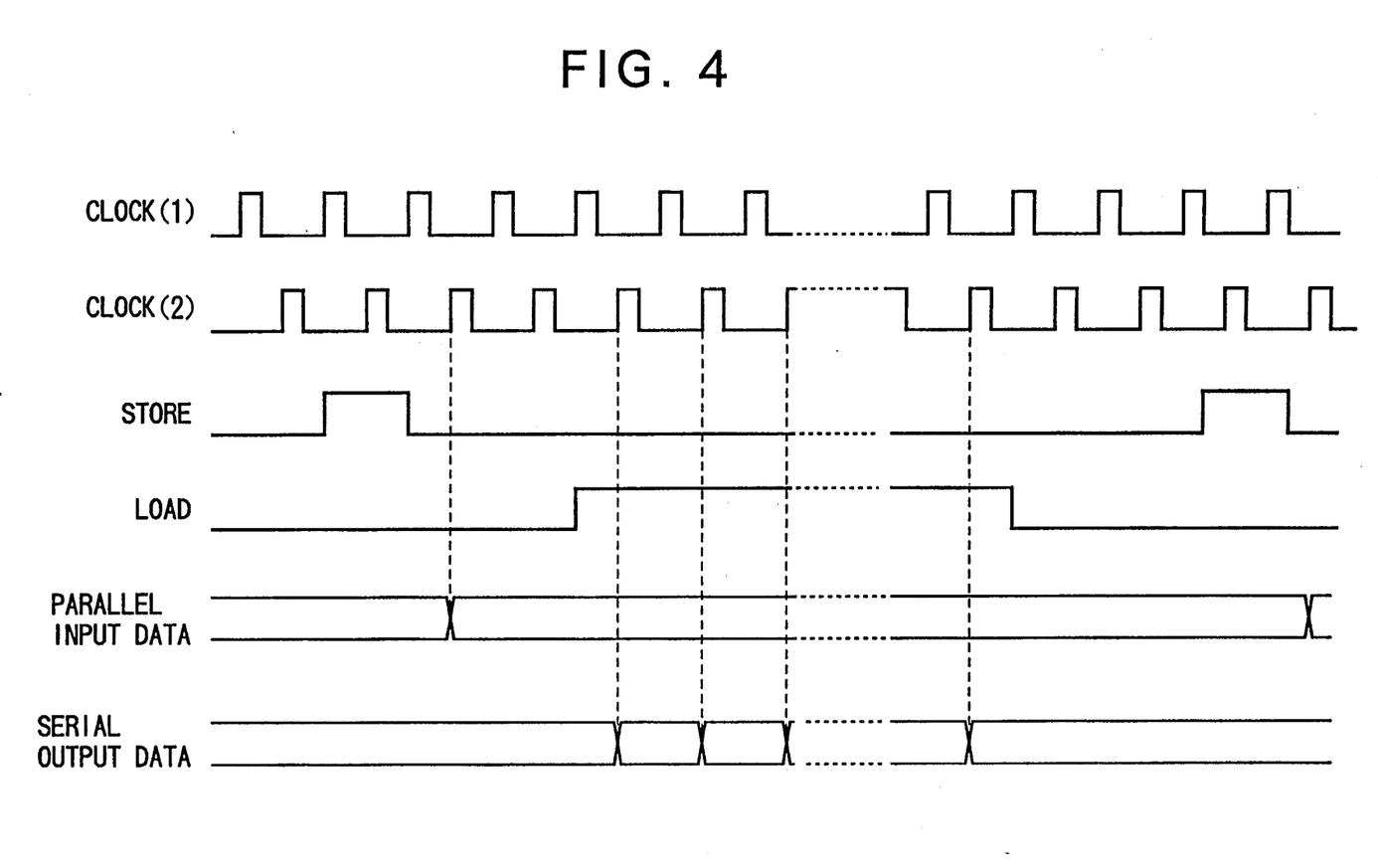
FIG. 4 is a timing chart to show the operation of the second embodiment.

FIG. 3 shows the configuration of a parallel-serial data converter according to a second embodiment of the present invention. In a data converter according to this embodiment, the latch circuits $13_{n-1}$ to $13_1$ and the latch circuit 23 in the first embodiment of FIG. 1 are replaced with the latch circuits $33_{n-1}$ to $33_1$ and 43 comprising two-phase D type flip-flops operating according to the master-slave method. For CLOCK signals, master CLOCK (1) and slave CLOCK (2) are provided. In addition to the AND circuit 15 which takes the logical AND the output from the OR circuit 14 and master CLOCK (1), another AND circuit 35 is added to AND the output from the OR circuit 14 and slave CLOCK (2). Except these points, this embodiment has the same configuration as in FIG. 1. FIG. 4 is a timing chart of input/output signals in conversion operation according to the second embodiment.

The second embodiment basically works in the same way as the first embodiment except that parallel data latching and serial data output are synchronized with the slave CLOCK (2). In this embodiment, adoption of latch circuits using master/slave method eliminates the need of consideration for delay time at the selectors $12_{n-1}$ to $12_1$ to ensure latching operation at the latch circuits as in the first embodiment.

Figure 5:
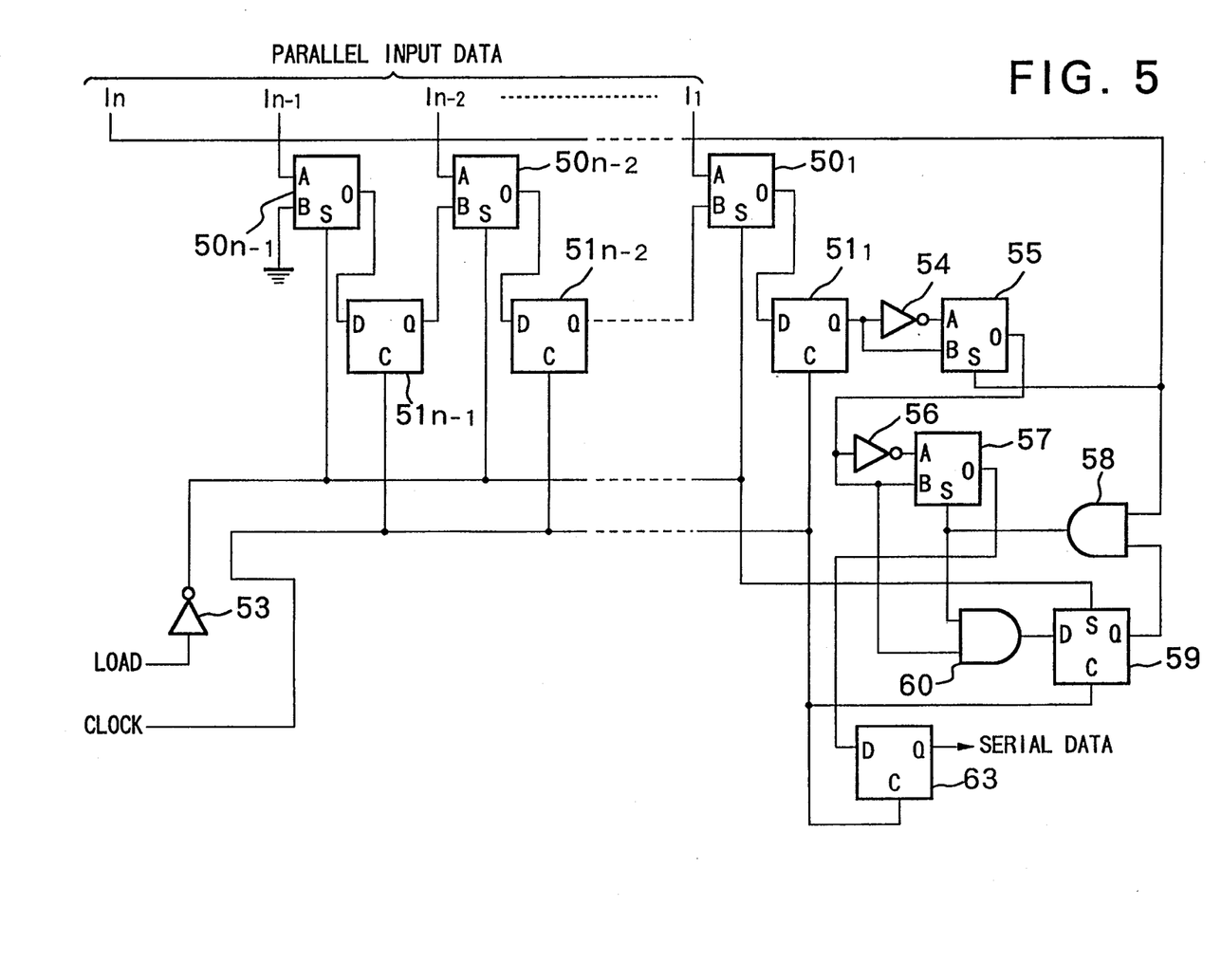
FIG. 5 is a block diagram to show the configuration of a parallel-serial data converter according to a third embodiment of the present invention.

Next, a third embodiment of the present invention is described. The third embodiment is a parallel-serial data converter which can cope with absence of the STORE signal. FIG. 5 is a block diagram to show the third embodiment. It is supposed here that the parallel data is fixed at least one clock before the LOAD signal and kept invariable while the LOAD signal is at H level. In other words, this is a circuit configuration to continue, even after the parallel data is fixed, to receive the same parallel data.

As shown in FIG. 5, a parallel-serial data converter according to the third embodiment comprises selectors $50_1, \ldots, 50_{n-2}$ and $50_{n-1}$, latch circuits $51_2, \ldots, 51_{n-2}$ and $51_{n-1}$, a latch circuit $51_1$, inverters 53 and 54, a selector 55, an inverter 56, a selector 57, AND circuits 58 and 60, a set latch circuit 59 and a latch circuit 63. From n bits of parallel data ($I_1, \ldots, I_{n-2}, I_{n-1}$ and $I_n$) in sign magnitude notation, the selectors $50_1, \ldots, 50_{n-2}$ and $50_{n-1}$ receive the data except the sign bit In ($I_1, \ldots, I_{n-2}$ and $I_{n-1}$) as input A. The latch circuits $51_2, \ldots, 51_{n-2}$ and $51_{n-1}$ which latch the outputs from the selectors $50_1, \ldots, 50_{n-2}$ and $50_{n-1}$ via the CLOCK signal and return them via the LOAD signal reversed at the converter 53 to the corresponding selectors $50_1, \ldots, 50_{n-2}$ as input B.

The latch circuit 51, the inverter 54, the selector 55, the inverter 56, the selector 57, the AND circuit 58, the set latch circuit 59 and the AND circuit 60 correspond to the latch circuit $13_1$, the inverter 16, the selector 17, the inverter 18, the selector 19, the AND circuit 20, the set latch circuit 21 and the AND circuit 22 in the first embodiment respectively.

Figure 6:
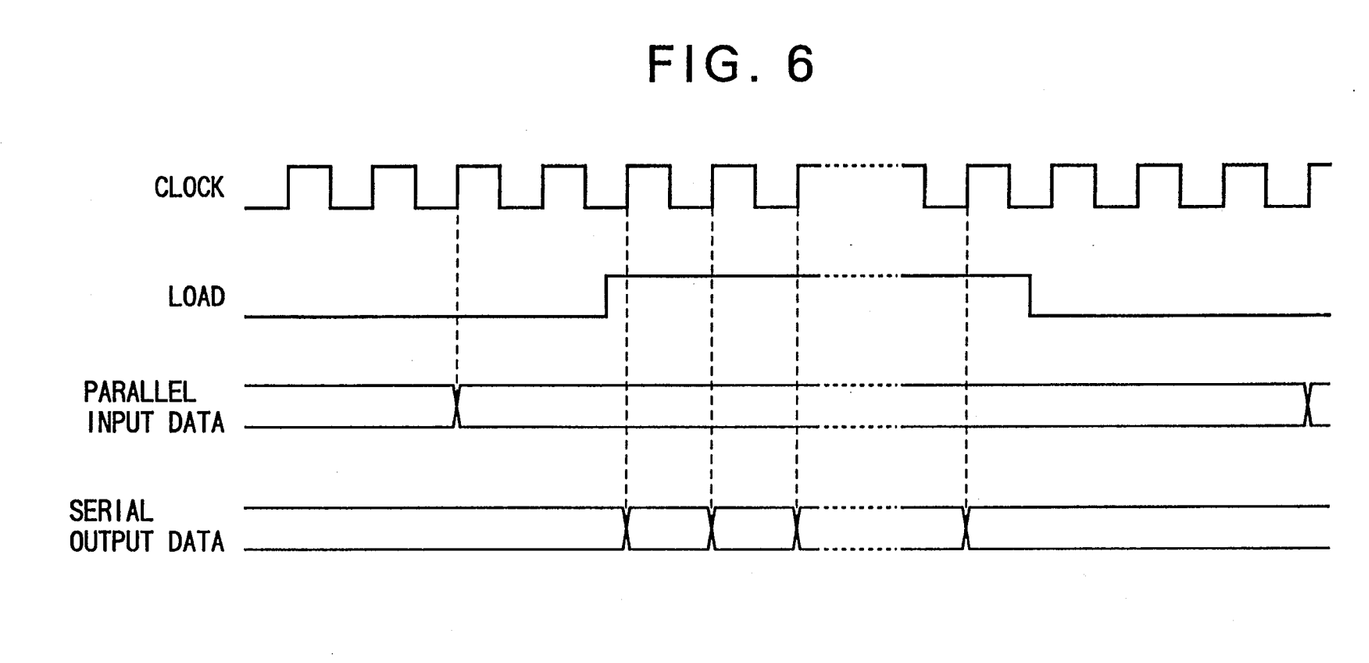
FIG. 6 is a timing chart to show the operation of the third embodiment.

Referring now to FIG. 6, which is a timing chart of input/output signals, the operation of the converter according to this embodiment is compared with that in the first embodiment. In the first embodiment as shown in FIG. 1, from n bit parallel data $I_1, \ldots, I_{n-2}, I_{n-1}$ and $I_n$ in sign magnitude notation, the parallel data except the sign bit In ($I_1, \ldots, I_{n-2}$ and $I_{n-1}$) are latched according to the STORE signal. In this embodiment, however, latching is made according to the CLOCK signal while the LOAD signal is at L level. The circuit comprising the latch circuit 51, the inverter 54, the selector 55, the inverter 56, the selector 57, the AND circuits 58 and 60 and the set latch circuit 59 as in the first embodiment operates in the same way as the first embodiment and the description is omitted.

Figure 7:
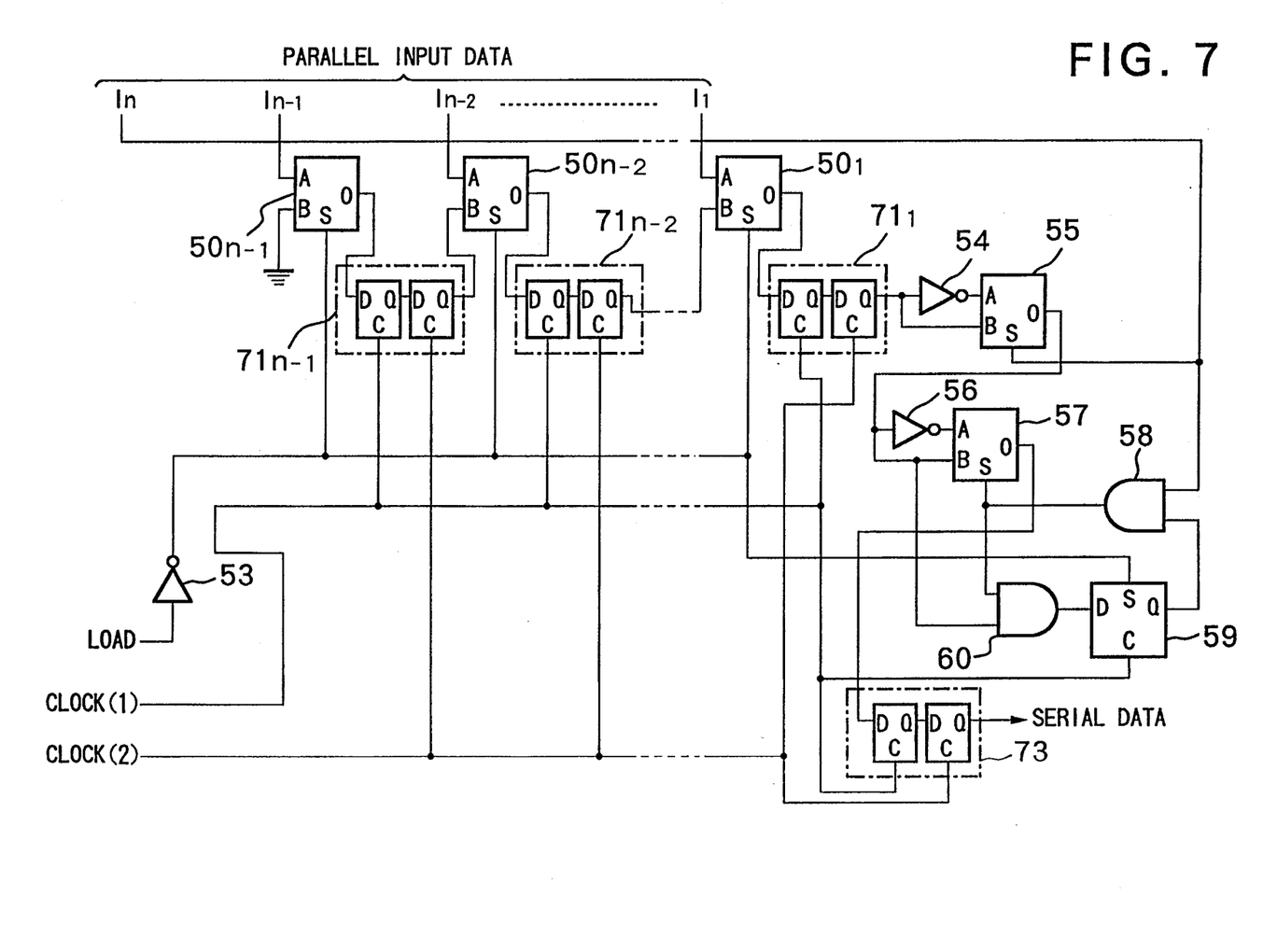
FIG. 7 is a block diagram to show the configuration of a parallel serial data converter according to a fourth embodiment of the present invention.

FIG. 7 is a parallel-serial data converter according to a fourth embodiment of the present invention. For this embodiment, the latch circuits $51_{n-1}$ to $51_1$ and the latch circuit 53 in the third embodiment are replaced with latch circuits $71_{n-1}$ to $71_1$ and a latch circuit 73 comprising two-phase D type flip-flops operating according to the master/slave method. For CLOCK signals, master CLOCK (1) and slave CLOCK (2) are input to the latch circuits.

Figure 8:
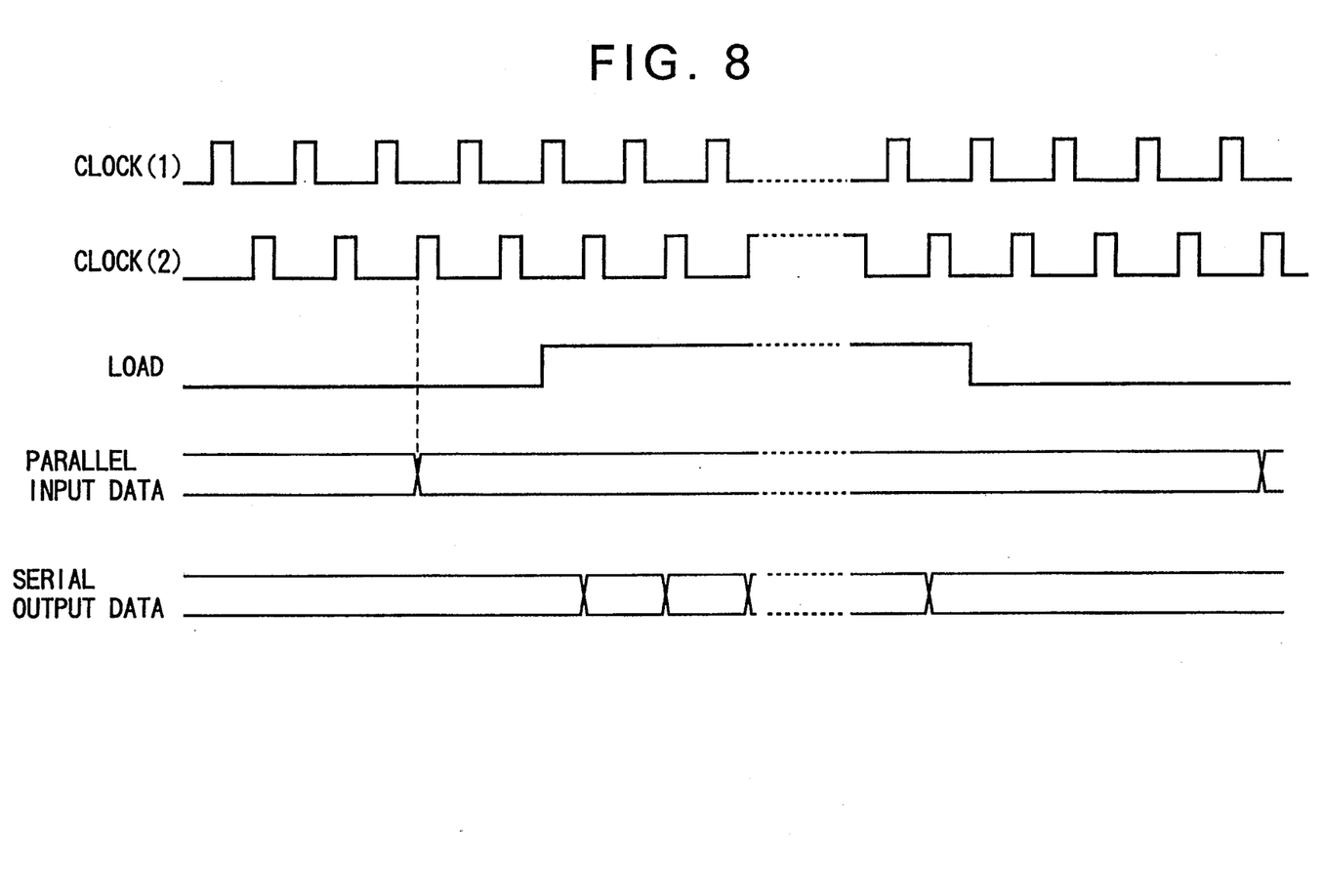
FIG. 8 is a timing chart to show the operation of the fourth embodiment.

FIG. 8 is a timing chart to show the operation in the fourth embodiment. Except that the parallel data latching and the serial data output are synchronized with the slave CLOCK (2), the operation is exactly the same as in the first and the third embodiments.

Thus, in the above embodiments, exclusive OR circuits and adders required for the number of bits in a conventional converter are replaced with a latch circuit and a set latch circuit, two selectors, two inverters and two AND circuits. This largely reduces the number of circuit elements resulting in a smaller scale circuit. The present invention is particularly effective when applied to a converter for a large number of bits.

Obviously, various modifications can be made to the above embodiments. It is intended to cover in the appended claims all such modifications and variations as fall within the true spirit and scope of the present invention.

What is claimed is:

1. A parallel-serial data converter to convert parallel data of n (positive integer) bits in sign magnitude notation into serial data in two's complement notation comprising:

a n-th circuit latching the sign bit at the most significant bit of said parallel data according to a STORE signal;

a n−1th selector receiving the n−1th bit of said parallel data as the first input and the ground level as the second input and selecting either of them for output according to said STORE signal;

a n−1th latch circuit latching the output from said n−1th selector according to a predetermined CLOCK signal;

a i-th selector receiving the i-th bit of said parallel data (i=n−2, n−3, ..., 2 and 1) as the first input and the output from a i+1th latch circuit as the second input and selecting either of them for output according to said STORE signal;

a i-th latch circuit latching the output from said i-th selector according to said CLOCK signal;

a first inverter inverting the output from said first latch circuit;

a n-th selector receiving the output from said first inverter as the first input and the output from said first latch circuit as the second input and selecting either of them for output according to the output from said n-th latch circuit;

a second inverter which inverts the output from said n-th selector;

a n+1th selector receiving the output from said second inverter as the first input and the output from said n-th selector as the second input and selecting either of them according to the predetermined selection signal for output as the serial data in two's complement notation;

a first AND circuit taking the logical AND the output from said n-th selector and said selection signal;

a set latch circuit being set according to said STORE signal and latching the output from said first AND circuit according to said CLOCK signal; and a second AND circuit taking the logical AND the output from said set latch circuit and the output from said n-th latch circuit for output as said selection signal.

2. A parallel-serial data converter of claim 1, wherein said n-th latch circuit, said n−1th latch circuit and said i-th latch circuit comprise D type flip-flops.

3. A parallel-serial data converter of claim 1, wherein said n−1th and i-th latch circuits are designed to operate according to the master/slave method with two D type flip-flops which latch according to CLOCK signals of two different phases.

4. A parallel-serial converter of claim 1, which further comprises an OR circuit for taking the logical OR of said STORE signal and a LOAD signal to direct serial data output and an AND circuit for taking the logical AND the output from said OR circuit and said CLOCK signal, the output from said AND circuit being used as the clock signal for said n−1th latch circuit, said i-th latch circuit and said set latch circuit.

5. A parallel-serial data converter to convert parallel data of n (positive integer) bits in sign magnitude notation into serial data in two's complement notation comprising:
   a n−1th selector receiving the n−1th bit of said parallel data as the first input and the ground level as the second input and selecting either of them for output according to a inverted LOAD signal;
   a n−1th latch circuit latching the output from said n−1th selector according to a predetermined CLOCK signal;
   a i-th selector receiving the i-th bit of said parallel data (1=n−2, n−3, . . . , 2 and 1) as the first input and the output from the i+1th latch circuit as the second input and selecting either of them for output according to said inverted LOAD signal;
   a i-th latch circuit latching the output from the i-th selector according to said CLOCK signal;
   a first inverter inverting the output from said first latch circuit:
   a n-th selector receiving the output from said first inverter as the first input and the output from said first latch circuit as the second input and selecting either of them for output according to the sign bit of said parallel data;
   a second inverter which inverts the output from said n-th selector;
   a n+1th selector receiving the output from said second inverter as the first input and the output from the n-th selector as the second input and selecting either of them according to the predetermined selection signal for output as the serial data in two's complement notation;
   a first AND circuit taking the logical AND the output from said n-th selector and said selection signal;
   a set latch circuit being set according to a STORE signal and latching the output from said first AND circuit according to said CLOCK signal; and
   a second AND circuit taking the logical AND the output from said set latch circuit and said sign bit of said parallel data for output as said selection signal.

6. A parallel-serial data converter of claim 5, wherein said n−1th latch circuit and said i-th latch circuit comprise D type flip-flops.

7. A parallel-serial data converter of claim 5, wherein said n−1th and i-th latch circuits are designed to operate according to the master/slave method with two D type flip-flops which latch according to CLOCK signals of two different phases.

* * * * *